(12) United States Patent
Ohtsuki et al.

(10) Patent No.: US 6,322,373 B1
(45) Date of Patent: Nov. 27, 2001

(54) CONTACT STRUCTURE OF ELECTRICAL CONNECTOR AND INSPECTING DEVICE THEREFOR

(75) Inventors: Tomonari Ohtsuki; Yasue Yamazaki, both of Tokyo (JP)

(73) Assignee: DDK Ltd., Tokyo (JP)

( * ) Notice: Subject to any disclaimer, the term of this patent is extended or adjusted under 35 U.S.C. 154(b) by 0 days.

(21) Appl. No.: 09/630,916

(22) Filed: Aug. 2, 2000

(30) Foreign Application Priority Data

Aug. 20, 1999 (JP) .................................................. 11-233635

(51) Int. Cl.$^7$ ............................... H01R 12/00; H05K 1/00
(52) U.S. Cl. ................................. 439/67; 439/66; 439/493
(58) Field of Search .................................. 439/67, 81, 493, 439/70, 66

(56) References Cited

U.S. PATENT DOCUMENTS

| | | | |
|---|---|---|---|
| 5,759,047 | * | 6/1998 | Brodsky et al. ........................ 439/66 |
| 6,053,746 | * | 4/2000 | Yoshizawa .............................. 439/67 |
| 6,142,789 | * | 11/2000 | Nolan et al. ............................ 439/66 |

* cited by examiner

*Primary Examiner*—Brian Sircus
*Assistant Examiner*—Michael C. Zarroli
(74) *Attorney, Agent, or Firm*—Baker Botts L.L.P.

(57) ABSTRACT

A contact structure of an electrical connector including a first connector having a plurality of electric contacts and a second connector having a plurality of electric contact elements elastically and independently supported by forming slits close about the electric contact elements. When the first connector is first urged against the second connector, the electric contact elements are inclined at an angle α by the electric contacts. When the urging force of the first connector is then reduced, the electric contact elements are returned through an angle β which is less than the angle α to accomplish the electrical connection between the electric contacts and the electric contact elements. An inspecting device for such an electrical connector includes a housing having a fitting opening for the first connector, a cover pivotally connected to the housing and having an anchoring portion engageable with an engaging portion of the housing, and a block for mounting the second connector thereon. The engagement of the anchoring portion and the engaging portion with a clearance corresponds to the inclination of the electric contacts elements of the second connector at the angle α, and the engagement without the clearance corresponds to the inclination of the electric contact elements which has been returned through the angle β from the inclination at the angle α.

4 Claims, 10 Drawing Sheets

CONTACT STRUCTURE OF ELECTRICAL CONNECTOR AND INSPECTING DEVICE THEREFOR

BACKGROUND OF THE INVENTION

This invention relates to a contact structure of an electrical connector including a first connector having a plurality of electric contacts and a second connector having a plurality of electric contact elements for electrically connecting these electric contacts and the electric contact elements, and more particularly to an inspecting device for inspecting the performance of the first connector.

For electrically connecting contacts of electrical connectors, in general, the butt contact and the sliding contact have been used. The known sliding contact and a known inspecting device therefor will be explained by referring to FIGS. 7 to FIGS. 10A and 10B.

As shown in FIG. 7, a hitherto used electrical connector includes a first connector 10 and a second connector 20 which are brought into abutment against each other to electrically connect a plurality of electric contacts 12 made of solder or the like in the form of hemispherical protrusions provided on one surface of a connector plate 11 of the first connector 10 to a plurality of electric contact elements 26 provided on one surface of a board 22 of the second connector 20. Such an electrical connector has typically a plug and socket mechanism (not shown) for detachably connecting the first and second connectors 10 and 20.

In order to give an elasticity to the electric contact elements 26 of the second connector 20, its board 22 is formed with slits 24 to form small tongue-shaped movable pieces which are parts of the board 22 for elastically supporting the electric contact elements 26, respectively. With this construction, when the first connector 10 is urged toward the second connector 20 in the direction shown by an arrow T, the electric contacts 12 of the first connector 10 cause the electric contact elements 26 of the second connector 20 to move downwardly as viewed in FIG. 7.

The known inspecting device for inspecting the performance of such an electrical connector, particularly, the first connector described above will be explained by referring to FIG. 8. The second connector 20 is fixed by a housing 48 and a block 52 so as to be embraced therebetween. The second connector 20 extends with its edges from the housing 48 and the block 52 and fixed to a hard substrate or board by soldering. The housing 48 includes a fitting opening 66 into which the first connector 10 is inserted. A back-up plate 50 is arranged between the block 52 and the second connector 20 mounted thereon for maintaining the contacting pressure between the first and second connectors. The performance inspection will be effected by urging the first connector received in the fitting opening 66 of the housing 48 toward the second connector 20.

With the butt contact, if there are any dirt or foreign substances 40 (FIG. 9A) on the electric contact and electric contact element, a good electrical connection therebetween could not be obtained when they are caused to abut against each other. In order to overcome this problem, the sliding contact between the electric contact and the electric contact element has generally been employed so that the dirt or foreign substances on the contacting surfaces are wiped or removed by the relative movement between the electric contact and the electric contact element.

In more detail, as shown in FIGS. 9A to 9C, first an electric contact 12 of the first connector 10 contacts an electric contact element 26 at a contact point 29, and when the first connector 10 is then urged in the direction shown by an arrow U, the electric contact 12 slidably moves on the surface of the electric contact element 26 to a contact point 29'. However, during such a sliding movement, contaminations or foreign substances 40 are moved by the sliding electric contact 12 in the sliding direction so as to accumulate higher (FIG. 9A). FIG. 9B illustrates the electric contact 12 in FIG. 9A in two different positions 29 and 29' in one drawing. With such a higher accumulation 42, the electric contact 12 tends to ride over the accumulation 42 so that the electric contact 12 is rolled or inclined (FIG. 9C) as shown by an arrow V, causing a defective electrical connection between the electric contact 12 and the electric contact element 26.

With an electrical connector having such a contact structure, when the electrical connector is set in an inspecting device to inspect its performance, the defective electrical connection due to the accumulation described above would often be caused, making it impossible to effect a stable inspection.

In order to solve this problem, the inventors of the present application have proposed a contact structure in Japanese Patent Application No. H10-267,393 as shown in FIGS. 10A and 10B. As shown in FIG. 10A, a board 22 of a second connector 20 is formed with slits closely around electric contact elements 26 so that the electric contact elements 26 are elastically supported by small tongue-shaped movable pieces of the board 22 formed by the slits, respectively. Each of the small tongue-shaped movable pieces supporting the electric contact element is previously inclined at an angle γ as shown in FIG. 10A. When the first connector 10 is fitted with the second connector 20, the electric contact 12 of the first connector 10 urges the electric contact element 26 supported by the small tongue-shaped movable piece of the board 22 to bring the electric contact element 26 into the oppositely inclined position at an angle δ as shown in FIG. 10B. The relation between the angles γ and δ is γ>δ.

However, such a contact structure suffers a disadvantage from the required inclination of the small tongue-shaped movable pieces at the angle γ to increase in the number of steps for production.

SUMMARY OF THE INVENTION

It is an object of the invention to provide a contact structure of an electrical connector which eliminates the disadvantages of the prior art and which assures a stable electrical connection between contacts of first and second connectors without the riding of the electric contacts over the accumulations on the surfaces of the electric contacts, even if the rolling of the electric contacts occurs.

It is another object of the invention to provide an inspecting device for an electric connector which is able to inspect its performance under a stable condition.

In order to accomplish the first object of the invention, in a contact structure of an electrical connector including a first connector having a plurality of electric contacts and a second connector having a plurality of electric contact elements provided on its one side, said electric contacts and said electric contact elements being brought into electrical contact with each other when said first and second connectors are fitted with each other, and said second connector having slits to support said electric contact elements elastically and independently, according to the invention said contact structure of said first and second connectors is constructed such that when said electric contacts of the first connector are brought into contact with said electric contact elements of the second connector, the electric contact elements of the second connector are first inclined at an angle α relative to their initial positions before contacting with the electric contacts under the influence of urging force of said electric contacts of the first connector and the electric contact elements are then returned through an angle β which is in a relation of α>β by reducing said urging force of said electric contacts to accomplish a stable fitted state between said first and second connectors.

In a preferred embodiment of the invention, the angle α is 10° to 30°. If the angle α is more than 30°, the inclination of the electric contact elements is so abrupt that there can be a risk of small tongue-shaped movable pieces being damaged at their cantilevered bottom ends. The angle β may be determined to prevent the electric contacts from riding over foreign substance accumulations even if they are rolling.

In order to accomplish the another object of the invention, in an inspecting device for an electrical connector including a first connector having a plurality of electric contacts and a second connector having a plurality of electric contact elements provided on its one side, said electric contacts and said electric contact elements being brought into electrical contact with each other when said first and second connectors are fitted with each other, and said second connector having slits to support said electric contact elements elastically and independently, said inspecting device including a housing having a fitting opening for said first connector, and a block for mounting said second connector, according to the invention said housing comprises a cover pivotally connected to the housing to be pivotally movable relative thereto, said cover comprising an anchoring portion at its free end and an urging portion having a size able to be set in said fitting opening of the housing, said housing being provided with an engaging portion engageable with said anchoring portion with a clearance when said first connector received in said fitting opening of the housing is urged by said urging portion of the cover toward said second connector mounted on said block to incline the electric contact elements at an angle α by the electric contacts of said first connector, but said engaging portion engageable with said anchoring portion without said clearance when the urging force of said cover is then reduced to return said electric contact elements through an angle β onto the side of contacting said electric contacts.

In another aspect, in an inspecting device for an electrical connector including a first connector having a plurality of electric contacts and a second connector having a plurality of electric contact elements provided on its one side, said electric contacts and said electric contact elements being brought into electrical contact with each other when said first and second connectors are fitted with each other, and said second connector having slits to support said electric contact elements elastically and independently, said inspecting device including a housing having a fitting opening for said first connector, and a block for mounting said second connector, according to the invention said inspecting device comprises a handle having an absorption portion which can pick up said first connector by its suction force and transfer it into said fitting opening of said housing, by means of which handle said first connector is first urged toward said second connector mounted on said block to incline the electric contact elements at an angle α by the electric contacts of the first connector, and the urging force of said handle is then reduced to return the electric contact elements through an angle β onto the side of contacting said electric contacts.

The invention having the subject features described above can bring about the following significant effects.

(1) According to the invention, the electric contact elements elastically supported by the tongue-shaped pieces formed by the slits of the board of the second connector are inclined at the angle α by the urging force of the electric contacts of the first connector, and when the first and second connectors have been completely fitted with each other, the electric contact elements of the second connector are returned in the opposite direction with the aid of their reaction forces through the angle β whose relation to the angle α is α>β, a stable electrical connection can be accomplished because of no accumulation of foreign substances at a position where the electric contact may do the rolling.

(2) According to the invention, the electric contact elements of the second connector need not be previously inclined toward the first connector as in the prior art, so that the number of production steps can be reduced to decrease the cost of the electrical connector.

(3) According to the invention, the maximum inclined angle α of the electric contact elements is larger than the inclined angle β of the electric contact elements when the first and second connectors are completely fitted with each other. As a result, the contact point of the electric contacts of the first connector with the electric contact elements of the second connector is first at a point 30 (FIG. 2), second moved on the electric contact elements to a point 30' and third returned to a point 30", so that the electric contacts of the first connector remain stationary immediately before when they are about to return, with the result that there is no accumulation in the proximity of the final contact point 30".

(4) With the inspecting device according to the invention, as the engaging portion of the housing and the anchoring portion of its cover are engaged with each other with a clearance which makes it possible to return the electric contact elements by the amount of the clearance, it is ensured that the maximum inclined angle α of the electric contact elements is larger than the final inclined angle β in inspecting the first connector, and the inspection of the first connector becomes easier.

(5) With the inspecting device according to the invention, the inspection is carried out by effectively using the handle capable of holding the first connector with the absorption portion, and therefore it is easily ensured that the maximum inclined angle α of the electric contact elements is larger than the inclined angle β when the first and second connectors have been completely fitted with each other, and the inspection can be effected automatically.

The invention will be more fully understood by referring to the following detailed specification and claims taken in connection with the appended drawings.

DESCRIPTION OF THE PREFERRED EMBODIMENTS

Figure 1:
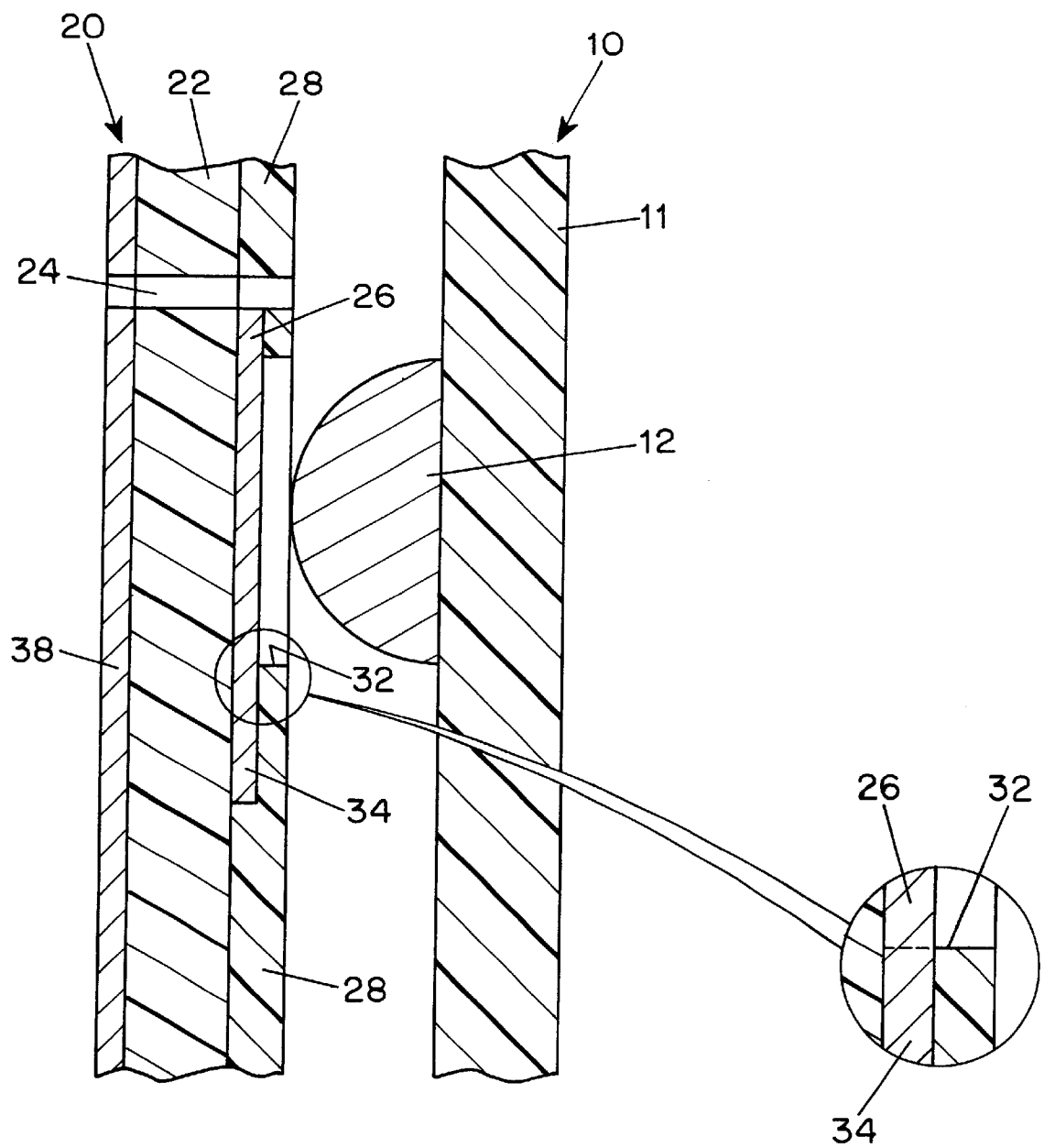
FIG. 1 is a partly sectional view of the electrical connector according to the invention.

FIGS. 1 to 4 illustrate one preferred embodiment of the electrical connector according to the invention. In the drawings, a first connector 10 including a connector plate 11 made of a ceramic or hard resin substrate or board having a rigidity, and a plurality of electric contacts 12 of solder or the like in the form of hemispherical protrusions provided on one surface of the connector plate 11. A second connector 20 includes a connector plate or board 22 made of a flexible or soft resin having an appropriate rigidity, a plurality of electric contact elements 26 of disc-shaped metal layers on one surface of the board 22, and a protection covering layer 28 of an insulating material provided on the board 22 on the same side as the electric contact elements.

Figure 4:
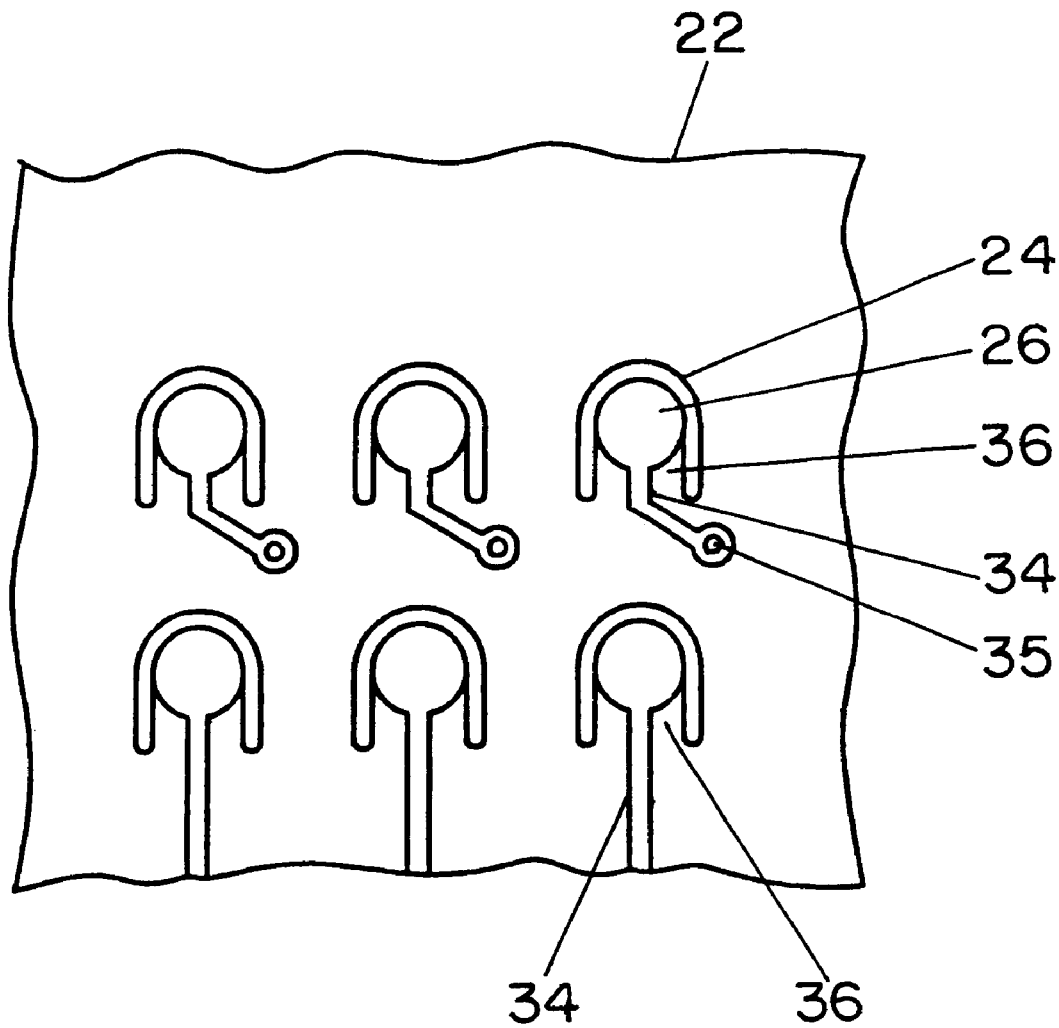
FIG. 4 is a plan view showing part of the second connector with electric contact elements shown in FIG. 1.

As shown in FIG. 4, for example, the electric contact elements 26 in the uppermost row are led through the through-holes 35 of the board 22 onto its rear side for the signal transmission or ground connection, while the electric contact elements 26 in the lowermost row are led through lead wires 34 downwardly (viewed in FIG. 4) for the signal transmission.

With the electrical connector, the first and second connectors 10 and 20 are connected to each other with the aid of a plug and socket mechanism in the conventional manner. The plug and socket mechanism used in the present invention will be explained later in connection with the subject members constituting the invention. Needless to say, on the connector plate 11 of the first connector 10 on the opposite side of the electric contacts 12 there are provided required wirings such as printed circuits electrically connected to the electric contacts 12.

The construction of the second connector 20 will be explained before the explanation of the contact structure between the first and second connectors 10 and 20, which is subject feature of the invention.

According to the invention, the required electric contact elements 26 are provided on one surface of the board 22, for example, by treating a metal layer such as a copper foil previously provided thereon by means of the printed circuit forming method which is one of the board producing techniques.

Therefore, a great number of electric contact members 26 can be produced extremely inexpensively without requiring a large space. Also, lead wires 34 to be connected to the electric contact elements 26 may of course be produced by the printed circuit forming method. In the case of lack of space for arranging the lead wires 34 on the board 22 due to the electric contact elements 26 arranged in high density, the lead wires 34 may be formed on the rear surface of the board 22 so as to communicate with the electric contact elements 26 through holes 35 (FIG. 4) provided at appropriate locations in the board 22.

Moreover, the board 22 is formed with inverted U-shaped slits 24 closely around the electric contact elements 26 in a simple manner by press-punching, laser machining or the like. Because of the particular shape of the slits 24, the electric contact elements 26 are elastically supported by small tongue-shaped movable pieces 36 located inside the respective slits 24.

Preferably, the protection covering layer 28 is provided all over the board 22 with exception of the portions corresponding to the slits 24 formed in the board 22 and openings 32 facing to the first connector plate 11 as shown in FIG. 1. The protection covering layer 28 may be formed in a simple manner by the press-punching, laser machining or the like. The openings 32 are preferably filled with metal layers as by plating, which are joined with the electric contact elements 26, respectively, although the openings 32 may be left as spaces. By filling the openings 32 with such metal layers, the electric contact elements 26 are in turn reinforced to provide the robust electric contact elements superior in durability.

With this construction, as the electric contact elements 26 have the elasticity, when the second connector 20 is brought into abutment against the first connector 10 so that the electric contact elements 26 abut against the electric contacts 12 of the hemispherical protrusions on the connector plate 11 of the first connector 10, the electric elements 26 capable of resiliently following the electric contacts 12 will elastically contact them to keep the stable electrical connection therebetween even if there are some differences in height between the elastic contacts 12.

In this manner, the electrical connection between the first and second connectors is accomplished with high reliability. As the elasticity for the electric contact elements 26 depends upon the elasticity of the small tongue-shaped movable pieces 36 of the board 22, it is required for the board 22 of the flexible or soft resin to have a rigidity to an extent such that a sufficient elasticity is given to the small tongue-shaped movable pieces 36.

The contact structure between the first and second connectors 10 and 20 will be explained herein by referring to FIG. 2. First, when the first connector 10 is being lowered in the direction shown by an arrow P in FIG. 2, the electric contact 12 of the first connector 10 will contact the electric contact element 26 of the second connector 20 at its contact point 30 positioned in the position A (horizontal position). When the first connector 10 is further lowered, the electric contact 12 of the first connector 10 will slidably move on the electric contact element 26 of the second connector 20 toward the right viewed in FIG. 2 maintaining the contact therebetween until the electric contact element 26 assumes an inclined position B at an angle α relative to the horizontal position A where the electric contact 12 contacts the electric contact element 26 at its contact point 30'.

Figure 2:
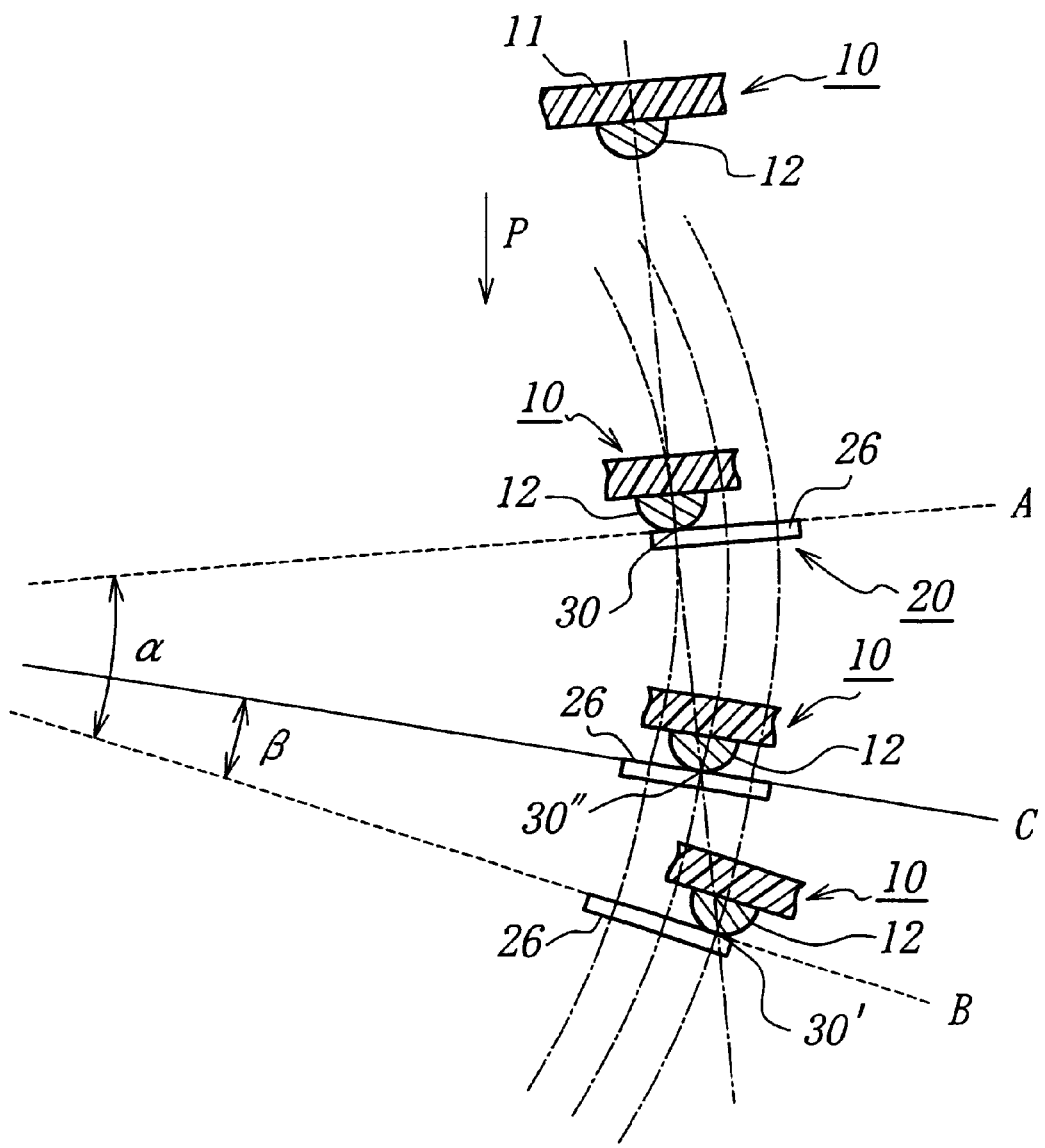
FIG. 2 is a schematic sectional view illustrating movements of electric contacts contacting with each other according to the invention.

Thereafter, when the force urging the first connector 10 downwardly viewed in FIG. 2 is somewhat reduced, the electric contact 12 of the first connector 10 is returned under the influence of the reaction force of the electric contact element 22 through an angle β to a position C where the electric contact 12 contacts the electric contact element 26 at its contact point 30". In other words, the electric contact element 26 is returned through the angle β in the opposite direction. The method for reducing the force urging the first connector 10 will be explained in connection with the inspecting device described later.

The relation between the angles α and β is α>β. The angle α is within a range of 5° to 45°, preferably 10° to 30°. If the angle α is not less than 45°, the electric contact element 26 does not move smoothly in the vertical direction. If the angle α is not more than 5°, the electric contact 12 slidably moves only a short distance on the electric contact element 26, so that the final contact between the electric contact 12 and the electric contact element 26 at the location sufficiently spaced apart from dirt or foreign material accumulation 42 (FIGS. 3A and 3B) becomes difficult. The angle β may be any angle so long as it is less than α. It is sufficient for β to be 1° to 3° less than α.

Figure 3A:
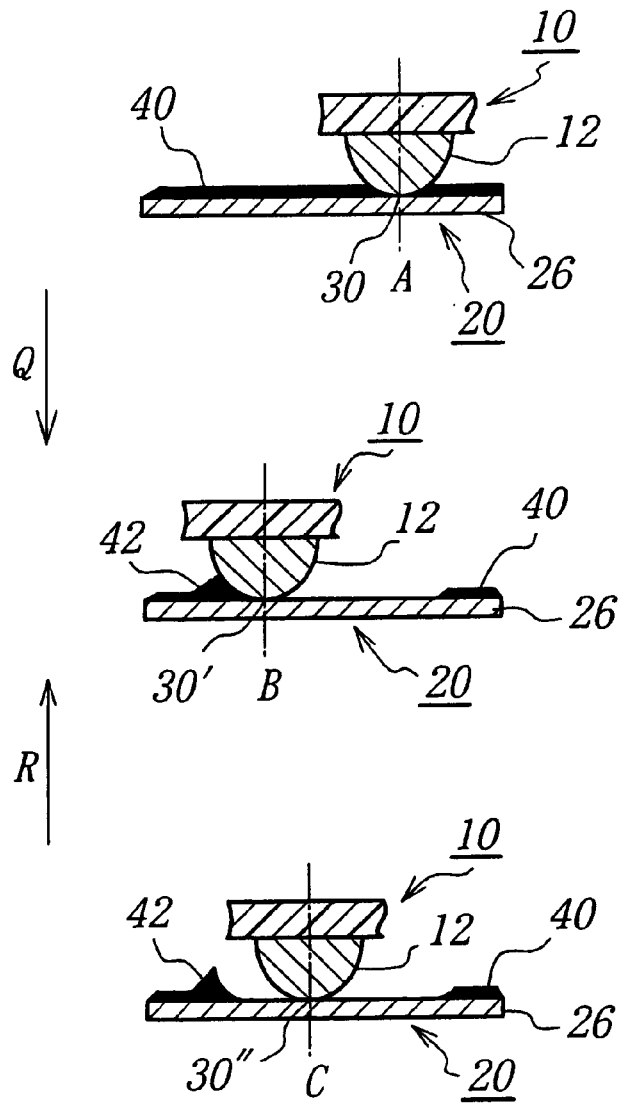
FIG. 3A is a schematic view illustrating one electric contact and movements of foreign substance accumulations according to the invention.
Figure 3B:
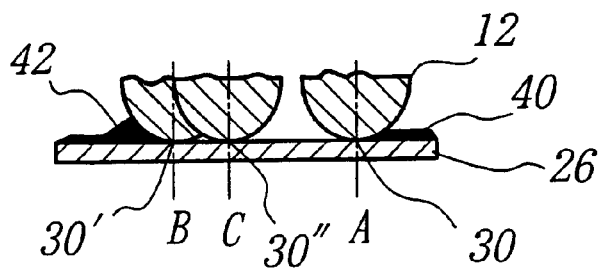
FIG. 3B is a view illustrating the features shown in FIG. 3A in one drawing.

The movement of the electric contact 12 and the electric contact element 26 shown in FIG. 2 will be explained in more detail by referring to FIGS. 3A and 3B additionally illustrating dirt or foreign material 40 and accumulation 42. Referring to FIG. 3A, first, the electric contact 12 of the first connector 10 will contact the electric contact element 26 of the second connector 20 at the contact point 30 in the horizontal position A. When the first connector 10 is urged in the direction shown by an arrow Q, the electric contact 12 of the first connector 10 will slidably move on the electric contact element 26 to the contact point 30' in the position B, while the dirt or foreign substances 40 are wiped or moved on the electric contact element 26 by the moving electric contact 12 to form an accumulation 42.

Thereafter, the force urging the first connector 10 is somewhat reduced, so that the electric contact element 26 of the second connector 20 is returned in the direction shown by an arrow R, during which the electric contact 12 slidably moves on that surface of the electric contact element 26 on which there is no contamination or dirt or foreign substance accumulation 42 because the surface has been wiped by the electric contact 12 moving from the contact point 30 to the contact point 30'. FIG. 3B illustrates in one drawing the series of these movements of the electric contact 12 on the electric contact element 26 from the contact point 30 to the contact point 30' and further to the contact point 30".

The relative positions of the electric contacts 12 and 26 are suitably designed in a manner such that the relation α>β is always maintained. In more detail, they are so designed that the electric contacts 12 of the first connector 10 will remain in a stationarily contacting condition with the electric contact elements 26 at a moment just before the electric contacts 12 of the first connector 10 starts to return toward the first contacting point 30 in the position A.

One embodiment of an inspecting device for carrying out the performance test of the first connector utilizing the contact structure of the electrical connector according to the invention described above will be explained by referring to FIG. 5.

Figure 5:
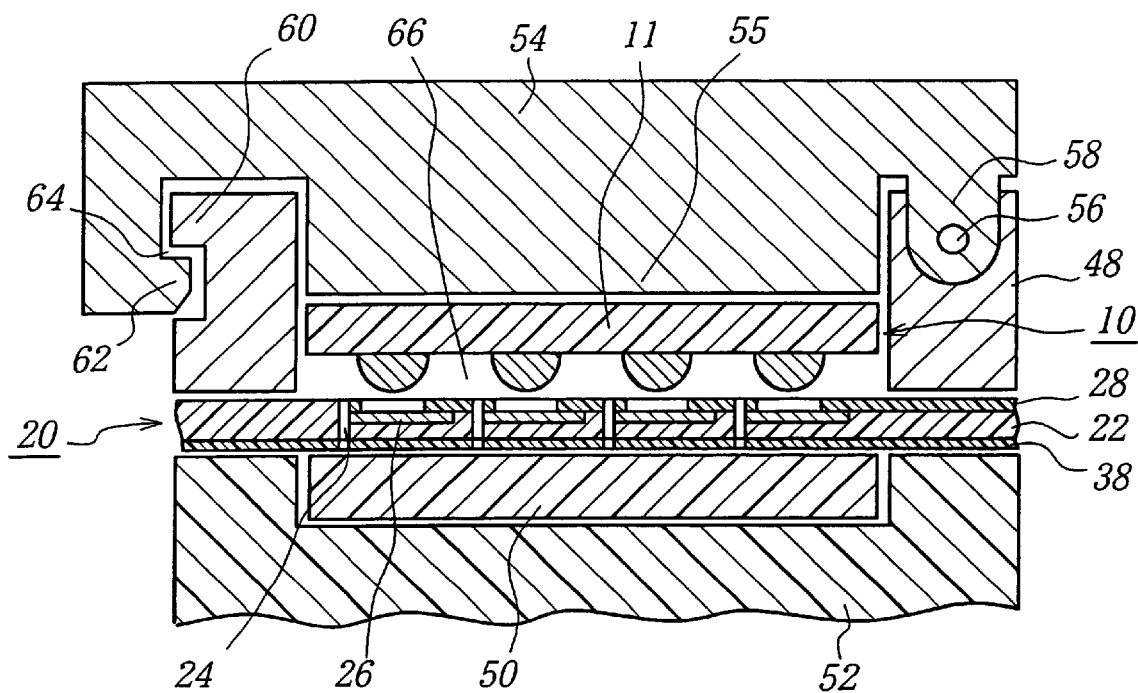
FIG. 5 is a partly sectional view of an inspecting device according to the invention.

As shown in FIG. 5, the device is of a socket type for receiving the connector plate 11 of the first connector 10 and includes a block 52 having a back-up plate 50 therein, a housing 48 formed with a fitting opening 66 for accommodating therein the connector plate 11 of the first connector 10, and a cover 54. The second connector 20 is fixed to the housing 48 and the block 52 and connected to a hard substrate or board as described in the explanation concerning the prior art. The reference numeral 38 indicates a ground plate. The housing 48 is provided with an engaging portion 60 adapted to engage the cover 54.

The cover 54 which is a subject matter of the device will be explained. The cover 54 is made of an insulating plastic material by the known injection molding. The materials from which to form the cover 54 include, in general, polybutylene terephthalate (PBT), polyamide (46PA, 66PA), liquid crystal polymer (LCP), polyphenylene sulfide (PPS), polyethylene terephthalate (PET) and the like.

The cover 54 is pivotally connected to the housing 48 by a shaft 56 supported in a shaft support 58 of the housing 48 so that the cover 54 is pivotally moved from its opened position to its closed position about the shaft 56. The cover 54 is further provided substantially at its center with an urging portion 55 adapted to be in the fitting opening 66 of the housing 48 and extending toward the block 52 at the position corresponding to the fitting opening 66 for the purpose of urging the connector plate 11 of the first connector 10 toward the second connector 20 when the cover 54 is pivotally moved to its closed position shown in FIG. 5.

The cover 54 is further provided on the opposite side of the shaft support 58 with an anchoring portion 62 adapted to engage the engaging portion 60 of the housing 48. Between the anchoring portion 62 and the engaging portion 60 is provided a clearance 64 which serves to return the electric contact elements 26 through the angle β, when the force urging the second connector 20 is reduced. The clearance 64 is suitably determined so as to maintain the relation α>β.

Explaining the series of the movements of the connector plate 11 of the first connector 10 in more detail, first, when the connector plate 11 of the first connector 10 is urged against the second connector 20 by the cover 54, there is the clearance 64 between the engaging portion 60 and the anchoring portion 62. The force urging the connector plate 11 is then reduced, the connector plate 11 of the first connector 10 is returned through a distance equivalent to the clearance 64 upwardly viewed in FIG. 5.

Figure 6:
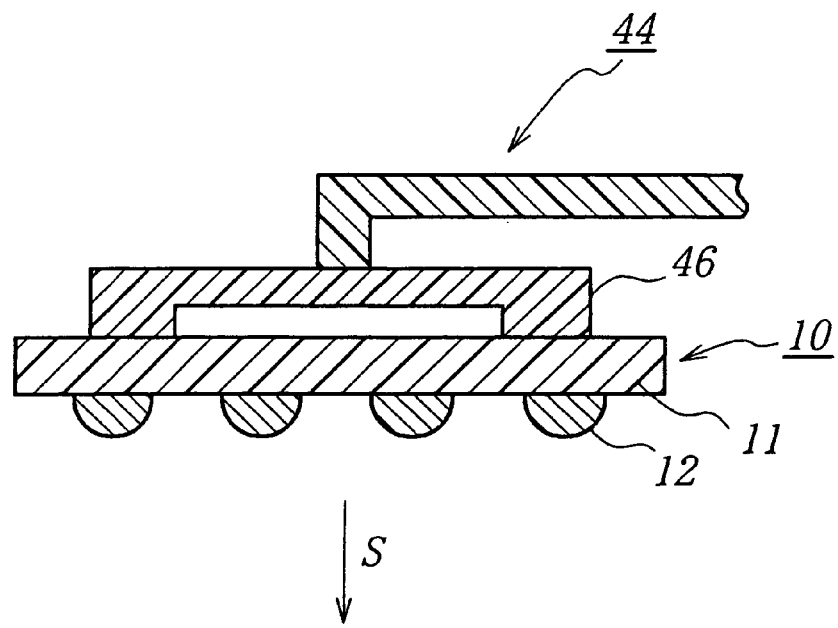
FIG. 6 is a partly sectional view of an inspecting device according to another embodiment of the invention.
Figure 6:
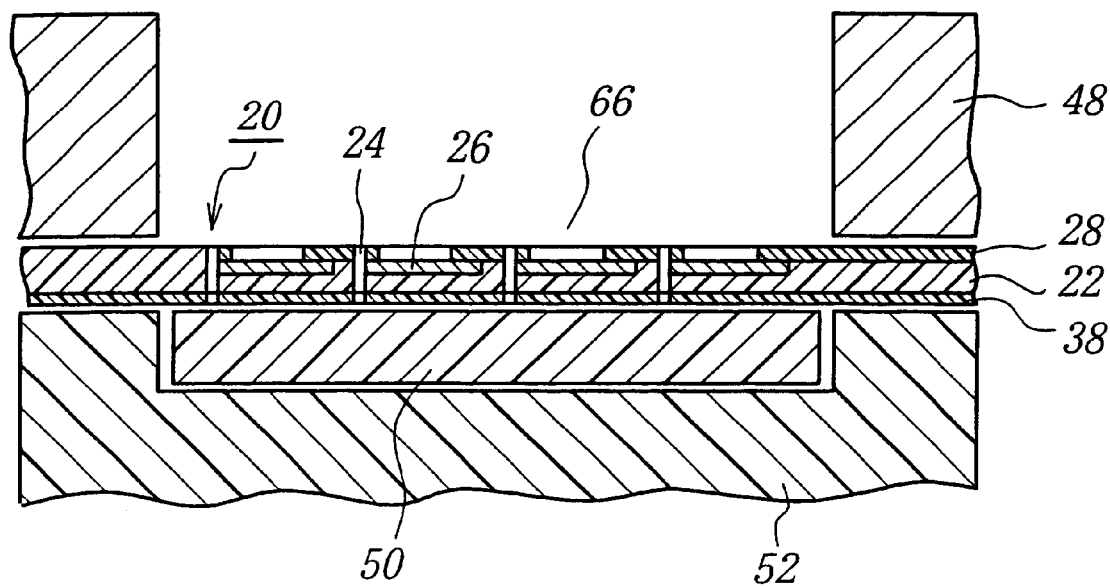
Figure 7:
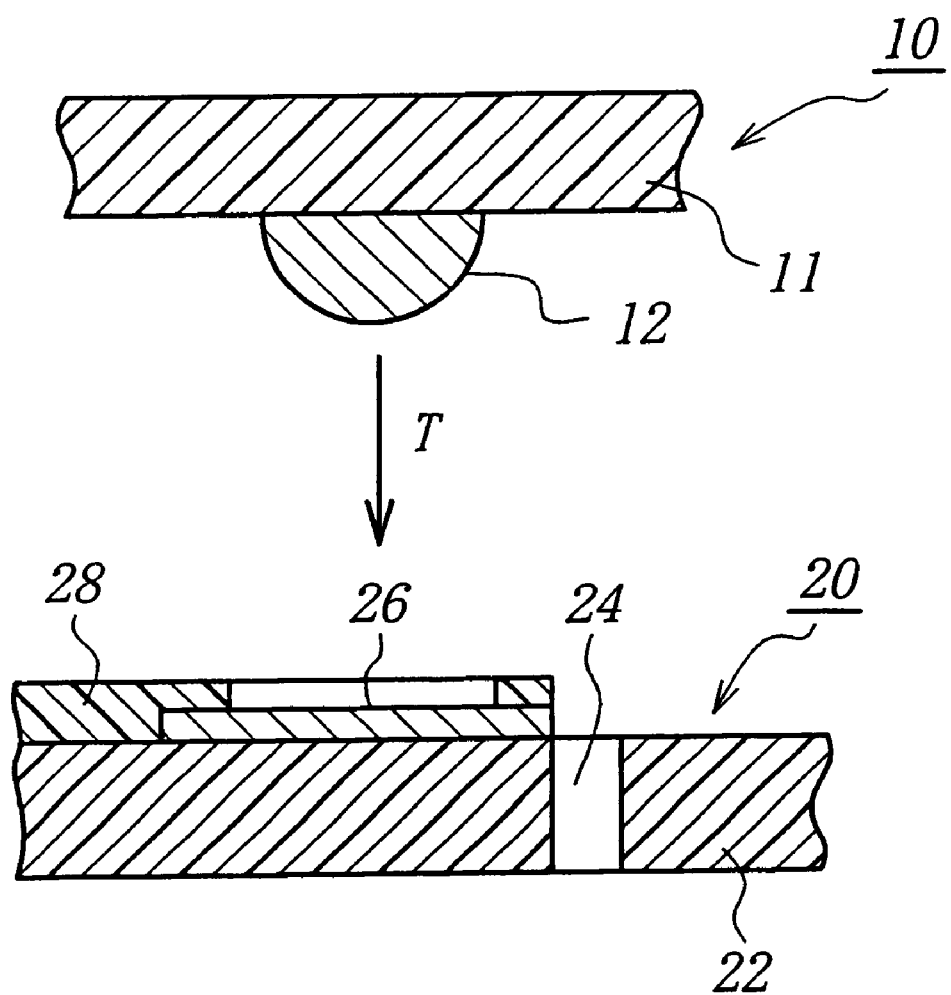
FIG. 7 is a partly sectional view of the electrical connector of the prior art.
Figure 8:
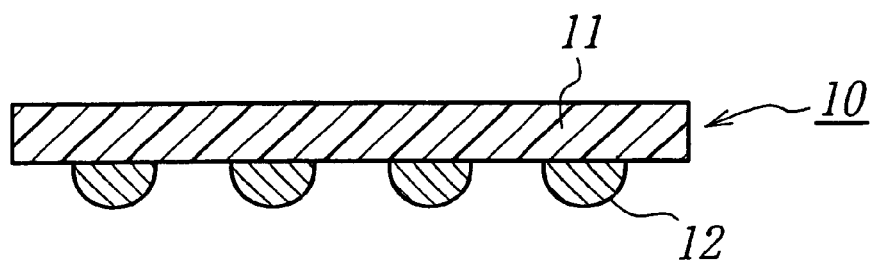
FIG. 8 is a partly sectional view of the inspecting device of the prior art.
Figure 8:
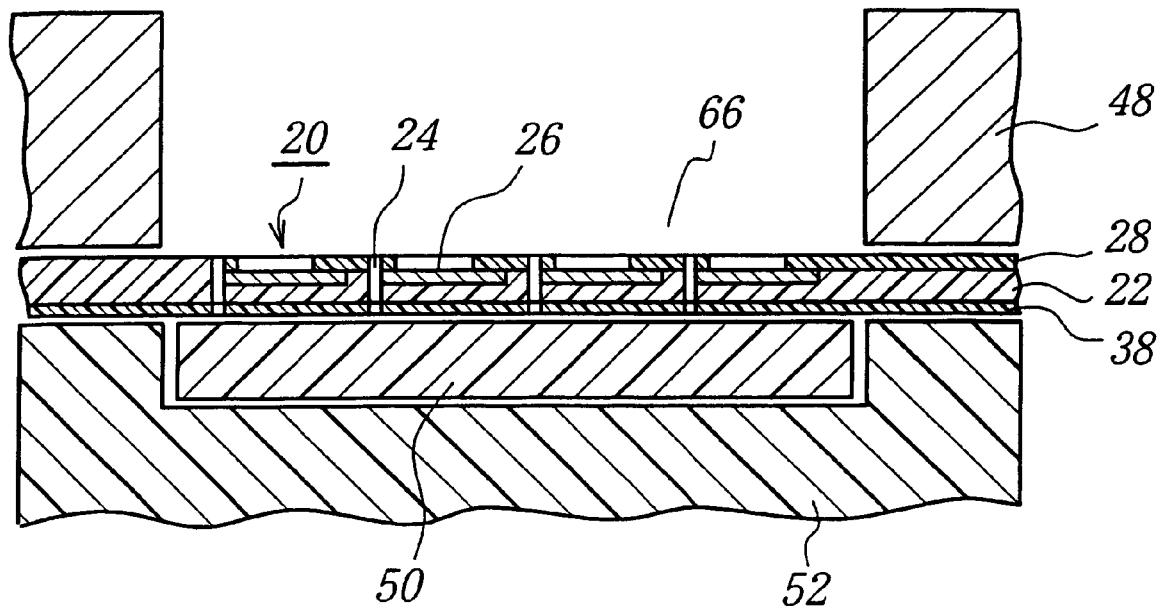
Figure 9A:
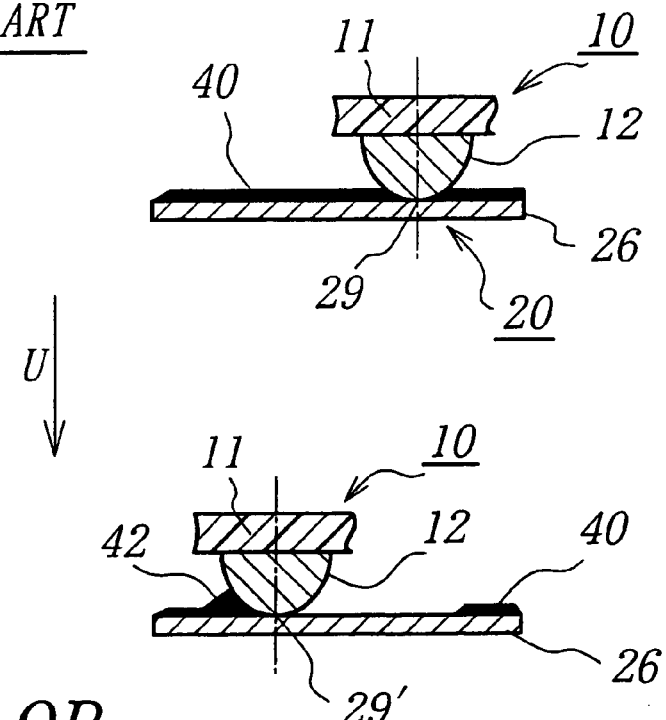
FIG. 9A illustrates movements of the electric contact of the prior art.
Figure 9B:
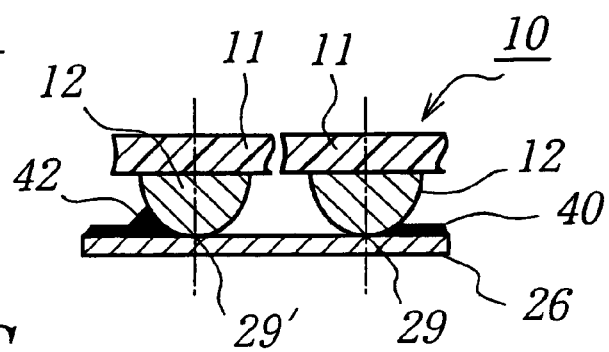
FIG. 9B is a view illustrating the features shown in FIG. 9A in one drawing.
Figure 9C:
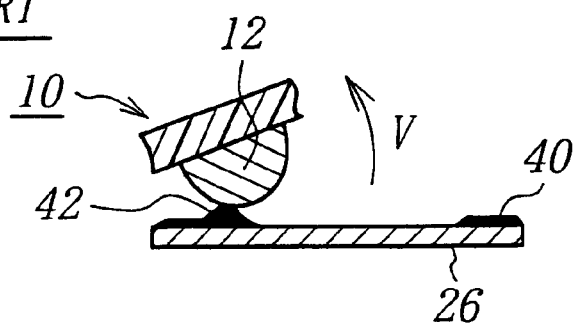
FIG. 9C is a view illustrating an electric contact of the prior art under a rolling condition.
Figure 10A:
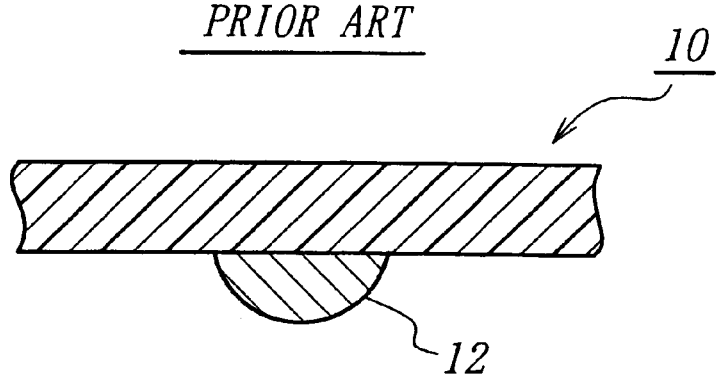
FIG. 10A is a partly sectional view of the first and second connectors of the prior art.
Figure 10A:
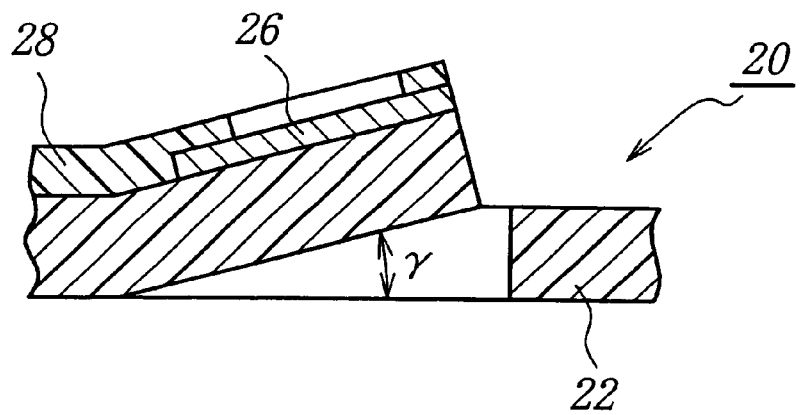
Figure 10B:
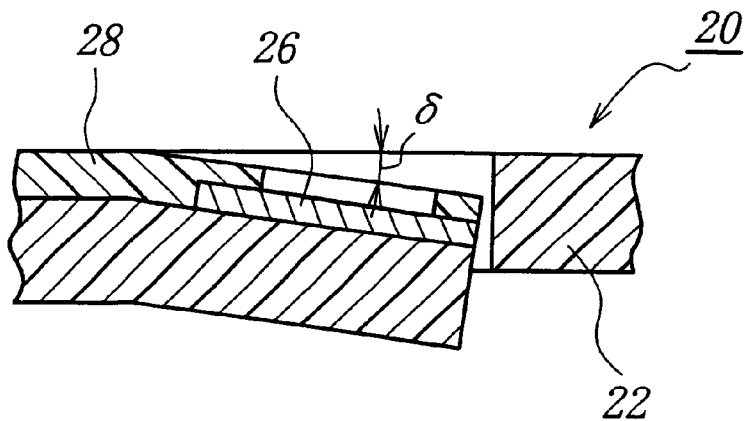
FIG. 10B is a partly sectional view of the second connector shown in FIG. 10A after contacted with the electric contact.

FIG. 6 illustrates another embodiment of the device for the performance test of the first connector 10 using the contact structure of the electrical connector according to the invention. The device shown in FIG. 6 is different from the device shown in FIG. 5 in that a handle 44 is used instead of the cover 54. The handle 44 has an absorption portion 46 which can pick up the first connector 10 by its suction force. The first connector 10 is picked up by the absorption portion 46 of the handle 44 and transferred and inserted into a fitting opening 66 of a housing 48 in the direction shown by an arrow S, where the first connector 10 is urged against the second connector 20 by means of the handle 44. The use of the handle 44 makes it possible to effect an automatic inspection for the electrical connector.

Continuing with the description of the movements of the first connector 10 in detail, the first connector 10 is picked up by the handle 44 with the aid of the absorption portion 46 and moved in the direction shown by an arrow S. The first connector 10 is then inserted into the fitting opening 66 of the housing 48 and urged against the second connector 20 by the urging force of the handle 44 to cause the electric contact elements 26 to incline at the angle α. Finally, the urging force of the handle 44 is reduced to raise the first connector 10 attached to the handle 44 by the suction force of the absorption portion 46 in the direction opposite to the arrow S, so that the electric contact elements 26 of the second connector 20 are returned through the angle β. With the series of the movements of the first connector 10, the performance test of the electrical connector, particularly the first connector, can be carried out.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A contact structure of an electrical connector including a first connector having a plurality of electric contacts and a second connector having a plurality of electric contact elements provided on its one side, said electric contacts and said electric contact elements being brought into electrical contact with each other when said first and second connectors are fitted with each other, and said second connector having slits to support said electric contact elements elastically and independently, wherein said contact structure of said first and second connectors is constructed such that when said electric contacts of said first connector are brought into contact with said electric contact elements of said second connector, said electric contact elements of said second connector are first inclined at an angle $\alpha$ under the influence of urging force of said electric contacts of said first connector, where said angle $\alpha$ is relative to initial positions of said electric contact elements of said second connector, said initial positions being locations of said electric contact elements prior to being contacted by said electric contacts of said first connector, and then said electric contact elements are returned through an angle $\beta$, which is in relation of $\alpha > \beta$, by reducing said urging force of said electric contacts to accomplish a fitted state between said first and second connectors.

2. The contact structure of the electrical connector as set forth in claim 1, wherein said angle $\alpha$ is within a range of 10° to 30 °.

3. An inspecting device for an electrical connector including a first connector having a plurality of electric contacts and a second connector having a plurality of electric contact elements provided on its one side, said electric contacts and said electric contact elements being brought into electrical contact with each other when said first and second connectors are fitted with each other, and said second connector having slits to support said electric contact elements elastically and independently, said inspecting device including a housing having a fitting opening for said first connector, and a block for mounting said second connector, wherein said housing comprises a cover pivotally connected to the housing to be pivotally movable relative thereto, said cover comprising an anchoring portion at its free end and an urging portion having a size able to be set in said fitting opening of the housing, said housing being provided with an engaging portion engageable with said anchoring portion with a clearance when said first connector received in said fitting opening of the housing is urged by said urging portion of the cover toward said second connector mounted on said block to incline the electric contact elements at an angle $\alpha$ by the electric contacts of said first connector, but said engaging portion engageable with said anchoring portion without said clearance when the urging force of said cover is then reduced to return said electric contact elements through an angle $\beta$ onto the side of contacting said electric contacts.

4. An inspecting device for an electrical connector including a first connector having a plurality of electric contacts and a second connector having a plurality of electric contact elements provided on its one side, said electric contacts and said electric contact elements being brought into electrical contact with each other when said first and second connectors are fitted with each other, and said second connector having slits to support said electric contact elements elastically and independently, said inspecting device including a housing having a fitting opening for said first connector, and a block for mounting said second connector, wherein said inspecting device comprises a handle having an absorption portion which can pick up said first connector by its suction force and transfer it into said fitting opening of said housing, by means of which handle said first connector is first urged toward said second connector mounted on said block to incline the electric contact elements at an angle $\alpha$ by the electric contacts of the first connector, and the urging force of said handle is then reduced to return the electric contact elements through an angle $\beta$ onto the side of contacting said electric contacts.

\* \* \* \* \*